(12) United States Patent
Kumar Kundu et al.

(10) Patent No.: US 10,826,520 B1
(45) Date of Patent: Nov. 3, 2020

(54) SUCCESSIVE APPROXIMATION REGISTER ANALOG-TO-DIGITAL CONVERTER

(71) Applicant: TEXAS INSTRUMENTS INCORPORATED, Dallas, TX (US)

(72) Inventors: Amal Kumar Kundu, Bengaluru (IN); Sovan Ghosh, Paschim Medinipur (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/536,507

(22) Filed: Aug. 9, 2019

(51) Int. Cl.
H03M 1/46 (2006.01)

(52) U.S. Cl.
CPC ........... *H03M 1/462* (2013.01); *H03M 1/466* (2013.01)

(58) Field of Classification Search
CPC ....... H03M 1/462; H03M 1/466; H03M 1/468
USPC ........................................ 341/161, 172, 155
See application file for complete search history.

(56) References Cited

U.S. PATENT DOCUMENTS

| | | | |
|---|---|---|---|
| 6,094,155 A * | 7/2000 | Fees | H03M 1/0863 327/401 |
| 6,124,818 A * | 9/2000 | Thomas | H03M 1/164 341/155 |
| 7,026,975 B1 * | 4/2006 | Steward | H03M 1/462 341/155 |
| 9,369,140 B1 * | 6/2016 | Sundaresan | G01S 7/5208 |
| 10,396,811 B1 * | 8/2019 | Rankin | H03M 1/1014 |
| 2005/0151680 A1 * | 7/2005 | Kearney | H03M 1/129 341/172 |
| 2010/0026546 A1 * | 2/2010 | Ohnhaeuser | H03M 1/08 341/172 |
| 2010/0176983 A1 * | 7/2010 | Ishikawa | H03M 1/0604 341/159 |
| 2012/0026027 A1 * | 2/2012 | Steensgaard-Madsen | H03M 1/466 341/161 |
| 2012/0105265 A1 * | 5/2012 | Agarwal | H03M 1/002 341/172 |
| 2019/0379288 A1 * | 12/2019 | Chaput | H02M 3/33584 |

* cited by examiner

*Primary Examiner* — Lam T Mai
(74) *Attorney, Agent, or Firm* — John R. Pessetto; Charles A. Brill; Frank D. Cimino

(57) ABSTRACT

An analog-to-digital converter includes a low voltage power supply rail, a high voltage power supply rail, successive approximation circuit, a level shifter, and a capacitive digital-to-analog converter (CDAC). The successive approximation circuitry is coupled to the low voltage power supply rail. The level shifter is coupled to the high voltage power supply rail and includes inputs coupled to first outputs of the successive approximation circuitry. The CDAC includes a first segment and a second segment. The first segment includes a first plurality of capacitors, and a first plurality of switches coupled to outputs of the level shifter. The second segment includes a second plurality of capacitors, and a second plurality of switches coupled to second outputs of the successive approximation circuitry.

14 Claims, 4 Drawing Sheets

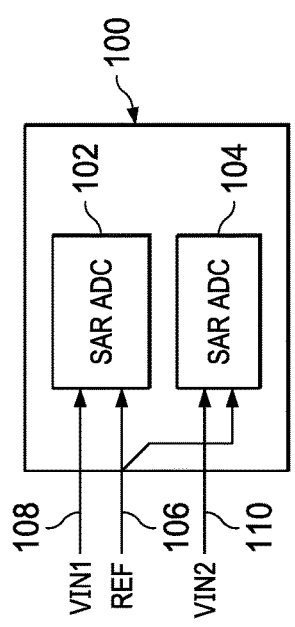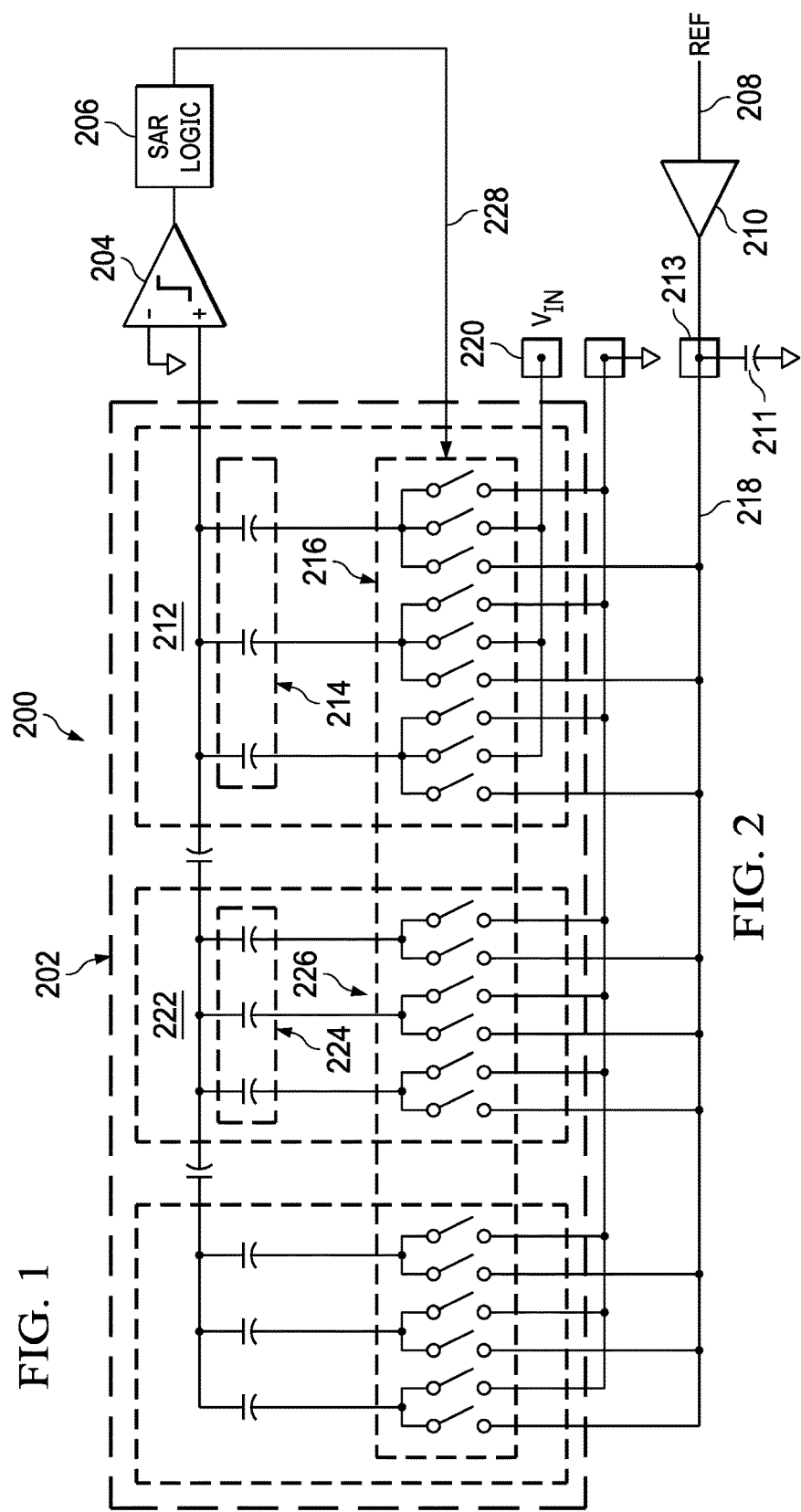

SUCCESSIVE APPROXIMATION REGISTER ANALOG-TO-DIGITAL CONVERTER

BACKGROUND

Various analog-to-digital data converters and conversion techniques are available for converting electrical signals from an analog domain to a digital domain. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample. The number of iterations typically affects the noise level of any result as well as the resolution of the ultimate digital signal.

The successive approximation register (SAR) converter is one example of an analog-to-digital converter (ADC). The SAR ADC performs a binary search for the digital value that best corresponds to the voltage of an analog signal. In a SAR ADC, a voltage input is compared with one half of a voltage reference. If the voltage input is greater than one half of the voltage reference, a logic '1' is stored in a register. Alternatively, if the voltage input is less than one half of the voltage reference, a logic '0' is stored in the register. Next, if the previous comparison indicated that voltage input is greater than one half of the voltage reference, the voltage input is compared with three-quarters of the voltage reference. Again, where the comparison indicates a greater than condition, then a logic '1' is stored in the register. In contrast, if the comparison indicates a less than condition, then a logic '0' is stored in the register. Alternatively, if the previous comparison indicated that voltage input is less than one half of the voltage reference, then voltage input is compared with one quarter of the voltage reference. Again, if the comparison indicates a greater than condition, then a logic '1' is stored in the register. In contrast, if the comparison indicates a less than condition, then a logic '0' is stored in the register. This process is continued for lower order multiples of the voltage reference. As will be appreciated, the aforementioned process is capable of providing an ADC result with high resolution in a relatively small amount of time. In particular, only a single iteration can be used to produce each bit of resolution. For example, for a ten-bit resolution only ten iterations are required, and for twenty bits of resolution only twenty iterations are required.

SUMMARY

Successive approximation register analog-to-digital converters with improved reference drive circuitry are disclosed herein. In one example, an analog-to-digital converter includes a low voltage power supply rail, a high voltage power supply rail, successive approximation circuitry, a level shifter, and a capacitive digital-to-analog converter (CDAC). The successive approximation circuitry is coupled to the low voltage power supply rail. The level shifter is coupled to the high voltage power supply rail and includes inputs coupled to first outputs of the successive approximation circuitry. The CDAC includes a first segment and a second segment. The first segment includes a first plurality of capacitors, and a first plurality of switches coupled to outputs of the level shifter. The second segment includes a second plurality of capacitors, and a second plurality of switches coupled to second outputs of the successive approximation circuitry.

In another example, an integrated circuit includes a reference voltage terminal, a first buffer circuit, a voltage divider, a second buffer circuit, a third buffer circuit, a first analog-to-digital converter, and a second analog-to-digital converter. The first buffer circuit includes an output coupled to the reference voltage terminal. The voltage divider is coupled to the output of the first buffer circuit. The second buffer circuit includes an input coupled to an output of the voltage divider. The first analog-to-digital converter includes a first CDAC coupled to an output of the first buffer circuit and an output of the second buffer circuit. The third buffer circuit includes an input coupled to the output of the voltage divider. The second analog-to digital converter includes a second CDAC coupled to the output of the first buffer circuit and the output of the third buffer circuit.

In a further example, an analog-to-digital converter includes a reference voltage terminal, a first buffer circuit, a voltage divider, a second buffer circuit, successive approximation circuitry, a level shifter, and a CDAC. The first buffer circuit includes an output coupled to the reference voltage terminal. The voltage divider includes an input coupled to an output of the first buffer circuit. The second buffer circuit includes an input coupled to an output of the voltage divider. The level shifter is coupled to first outputs of the successive approximation circuitry. The CDAC includes a first segment and a second segment. The first segment includes a first plurality of capacitors, and a first plurality of switches coupled to outputs of the level shifter, and to the output of the first buffer circuit. The second segment includes a second plurality of capacitors, and a second plurality of switches coupled to second outputs of the successive approximation circuitry, and to an output of the second buffer circuit.

BRIEF DESCRIPTION OF THE DRAWINGS

For a detailed description of various examples, reference will now be made to the accompanying drawings in which:

FIG. 1 shows a block diagram for an example integrated circuit that includes multiple analog-to-digital converters;

FIG. 2 shows a block diagram for an example analog-to-digital converter that includes a reference buffer;

DETAILED DESCRIPTION

Figure 3:
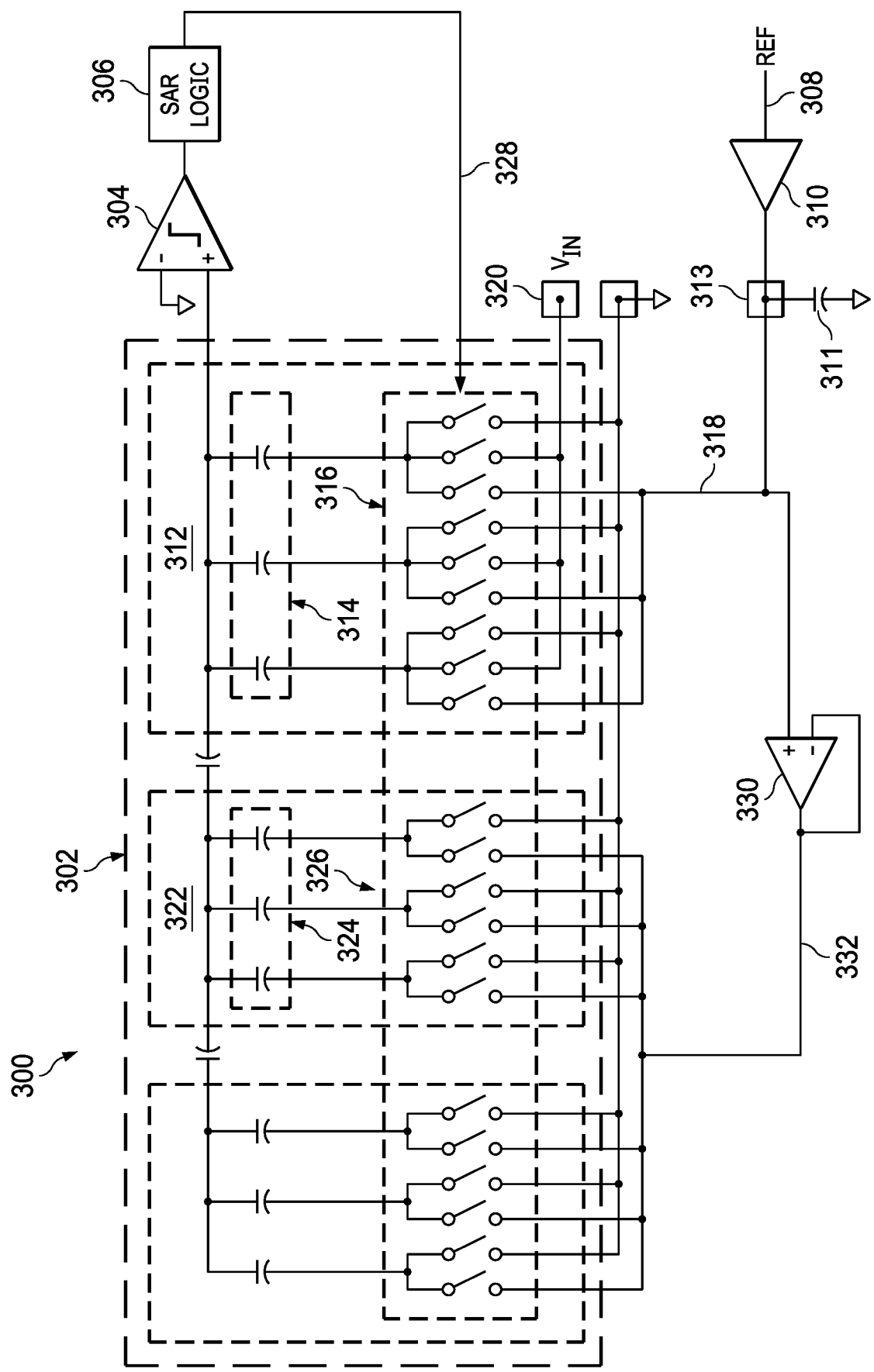
FIG. 3 shows a block diagram for an example analog-to-digital converter that includes multiple reference buffers.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Some high-speed successive approximation register (SAR) analog-to-digital converters employ a capacitive digital-to-analog converters (CDAC) that operates as a large capacitance to be charged in the conversion process. A reference voltage provided to the ADC is applied to charge the capacitance during conversion. To produce an accurate conversion result, the reference voltage must settle to a predetermined value within the time of a conversion cycle. Time required for the reference voltage to settle limits conversion time. The impedance of the reference voltage source should be relatively low to provide fast settling.

For conversion of large amplitude signals, the switches of the CDAC must be controlled with a correspondingly high voltage. However, control logic implemented in a high voltage process tends to be large and relatively slow. Some ADCs employ low voltage logic to reduce size, delay, and power consumption, but must include level shifters to drive the CDAC switches at the higher voltage. That level shifters add delay, and propagation through a level shifter for each conversion cycle increases conversion time. For example, a level shifter with propagation delay "N" for each bit of the CDAC increases conversion time by N times the number of bits.

Some circuit implementations include multiple SAR ADCs, which further increases the capacitance to be charged. In such circuits, a separate reference voltage pin is provided for each ADC so that noise on the reference voltage due to conversion timing of one ADC does not corrupt the reference voltage at another ADC. The multiple reference pins increase package size and pin count.

The SAR ADCs disclosed herein allow a single reference voltage pin to be used with multiple ADCs disposed on an integrated circuit, which reduced package cost and size. The ADCs include a high voltage buffer to buffer the reference voltage provided for conversion of bits of higher significance, and a low voltage buffer to buffer a fractional reference voltage for conversion of bits of lower significance. No level shifters are needed to control CDAC switches for conversion of bits using the low voltage buffer, which allows for a decrease in conversion time. Because most circuitry of the ADCs use a low voltage semiconductor process and is powered by low voltage, the power consumption and circuit area of the ADCs is reduced relative to an ADC built using a higher voltage process.

FIG. 1 shows a block diagram for an example integrated circuit 100 that includes multiple analog-to-digital converters in accordance with this description. The integrated circuit 100 includes a SAR ADC 102, a SAR ADC, a reference voltage terminal 106, a signal input terminal 108, and a signal input terminal 110. The reference voltage terminal 106 is coupled to the SAR ADC 102 and the SAR ADC 104 and provides a reference voltage for use in digitization. In some implementations of the integrated circuit 100, the reference voltage terminal 106 is provided for connecting a decoupling capacitor to the reference voltage external to the integrated circuit 100. The signal input terminal 108 is coupled to the SAR ADC 102 and provides a signal to be digitized by the SAR ADC 102. The signal input terminal 110 is coupled to the SAR ADC 104 and provides a signal to be digitized by the SAR ADC 104. The signal input terminal 108 and/or the signal input terminal 110 are internal to the integrated circuit 100 in some implementations of the integrated circuit 100. In some implementations of the integrated circuit 100, the SAR ADC 102 and the SAR ADC 104 are coupled in parallel to a first buffer that provides the reference voltage for use in a high voltage domain and a second buffer that provides a fraction of the reference for use in a low voltage domain. Thus, implementations of the integrated circuit 100 include only one reference voltage terminal 106 for provision of the reference voltage, which reduces the pin count and associated cost of the integrated circuit 100. Additionally, by operating most of the circuitry of the SAR ADC 102 and the SAR ADC 104 in a low voltage domain, circuit propagation delays are reduced, which allows for faster conversion times or longer settling times.

FIG. 2 shows a block diagram for an example analog-to-digital converter 200 that includes a reference buffer. The analog-to-digital converter 200 includes a CDAC 202, a comparator 204, successive approximation circuitry 206, and a buffer circuit 210. The comparator 204 is coupled to the CDAC 202 and compares output of the CDAC 202 to a threshold voltage to determine whether a current setting of the CDAC 202 exceeds the threshold voltage. The successive approximation circuitry 206 is coupled to the comparator 204 and the CDAC 202, and controls the CDAC 202 based on the output of the comparator 204. For example, if the output of the comparator 204 indicates that the output of the CDAC 202 exceeds the threshold voltage, then the successive approximation circuitry 206 changes the input to the CDAC 202 to identify a next highest value bit for which the output of the CDAC 202 does not exceed the threshold voltage.

The CDAC 202 is a split CDAC that includes multiple segments separated by a capacitor. Each segment includes multiple capacitors and a plurality of switches coupled to each capacitor. The CDAC 202 includes segment 212 and segment 222. Implementations of the CDAC 202 include two or more segments. The segment 212 includes capacitors 214 and switches 216. The switches 216 selectably connect one of the signal input terminal 220, the reference voltage 218, or ground to each of the capacitors 214. The switches 216 are coupled to the successive approximation circuitry 206 and controlled by the switch control signals generated by the successive approximation circuitry 206. Implementations of the analog-to-digital converter 200 include any number of capacitors 214, capacitors 224, switches 216, and switches 226 needed to provide a desired number of output bits.

The segment 222 includes capacitors 224 and switches 226. The switches 226 selectably connect one of the reference voltage 218 or ground to each of the capacitors 224. The switches 226 are coupled to the successive approximation circuitry 206 'and controlled by the switch control signals 228 generated by the successive approximation circuitry 206.

The buffer circuit 210 buffers the reference voltage 208 to produce the reference voltage 218 that is provided to the segment 212 and the segment 222 of the CDAC 202. The decoupling capacitor 211 is provided external to an integrated circuit that includes the analog-to-digital converter 200.

All circuitry of the analog-to-digital converter 200 is powered by a high voltage power supply (e.g., 5 volts), and includes semiconductor devices compatible with the high voltage power supply, which increases circuit size and power consumption. While the combination of the buffer circuit 210 and the decoupling capacitor 211 provide low impedance, the reference voltage 218 cannot be shared by multiple SAR ADCs (e.g., the SAR ADC 102 and the SAR ADC 104) due to bond-pad inductance that causes bit decisions in one SAR ADC to affect the reference voltage provided to another SAR ADC. Thus, an instance of the package pin 213 and the decoupling capacitor 211 must be included for each instance of the analog-to-digital converter 200 provided on a same integrated circuit, which increases package size and cost.

FIG. 3 shows a block diagram for an example analog-to-digital converter 300 that includes multiple reference buffers. The analog-to-digital converter 300 includes a CDAC 302, a comparator 304, successive approximation circuitry 306, a buffer circuit 310, and a buffer circuit 330. The comparator 304 is coupled to the CDAC 302 and compares output of the CDAC 302 to a threshold voltage to determine whether a current setting of the CDAC 302 exceeds the threshold voltage. The successive approximation circuitry 306 is coupled to the comparator 304 and the CDAC 302, and controls the CDAC 302 based on the output of the comparator 304. For example, if the output of the comparator 304 indicates that the output of the CDAC 302 exceeds the threshold voltage, then the successive approximation circuitry 306 changes the input to the CDAC 302 to identify a next highest value bit for which the output of the CDAC 302 does not exceed the threshold voltage.

The CDAC 302 is a split CDAC that includes multiple segments separated by a capacitor. Each segment includes multiple capacitors and a plurality of switches coupled to each capacitor. The CDAC 302 includes segment 312 and segment 322. Implementations of the CDAC 302 include two or more segments. The segment 312 includes capacitors 314 and switches 316. The switches 316 selectably connect one of the signal input terminal 320, the reference voltage 318, or ground to each of the capacitors 314. The switches 316 are coupled to the successive approximation circuitry 306 and controlled by the switch control signals 328 generated by the successive approximation circuitry 306. Implementations of the analog-to-digital converter 300 include any number of capacitors 314, capacitors 324, switches 316, and switches 326 needed to provide a desired number of output bits.

The segment 322 includes capacitors 324 and switches 326. The switches 326 selectably connect one of the reference voltage 332 or ground to each of the capacitors 324. The switches 326 are coupled to the successive approximation circuitry 306 and controlled by the switch control signals 328 generated by the successive approximation circuitry 306.

The buffer circuit 310 buffers the reference voltage 308 to produce the reference voltage 318 that is provided to the switches 316. The decoupling capacitor 311 is provided external to an integrated circuit that includes the analog-to-digital converter 300. The buffer circuit 330 is coupled to the buffer circuit 310 and buffers the reference voltage 318 to generate the reference voltage 332 provided to the switches 326.

All circuitry of the analog-to-digital converter 300 is powered by a high voltage power supply (e.g., 5 volts), and includes semiconductor devices compatible with the high voltage power supply, which increases circuit size and power consumption. Implementation of the buffer circuit 330 in a high voltage domain is challenging, and the relatively slow speed of the successive approximation circuitry 306 implemented in a high voltage process increases conversion time.

Figure 4:
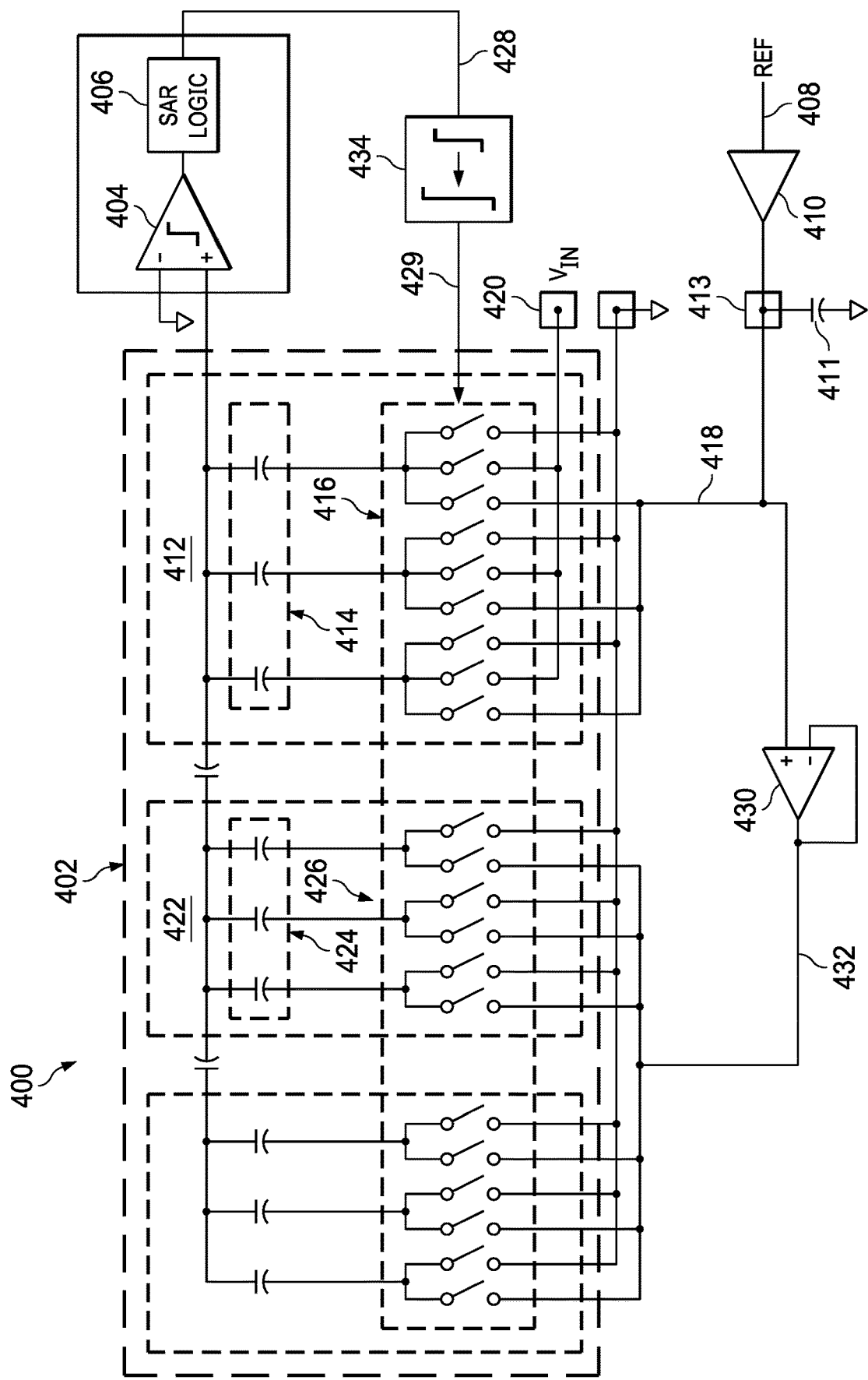
FIG. 4 shows a block diagram for an example analog-to-digital converter that includes low voltage successive approximation circuitry.

FIG. 4 shows a block diagram for an example analog-to-digital converter 400 that includes low voltage successive approximation circuitry. The analog-to-digital converter 400 includes a CDAC 402, a comparator 404, successive approximation circuitry 406, a level shifter 434, a buffer circuit 410, and a buffer circuit 430. The comparator 404 is coupled to the CDAC 402 and compares output of the CDAC 402 to a threshold voltage to determine whether a current setting of the CDAC 402 exceeds the threshold voltage. The successive approximation circuitry 406 is coupled to the comparator 404 and the CDAC 402, and controls the CDAC 402 based on the output of the comparator 404. For example, if the output of the comparator 404 indicates that the output of the CDAC 402 exceeds the threshold voltage, then the successive approximation circuitry 406 changes the input to the CDAC 402 to identify a next highest value bit for which the output of the CDAC 402 does not exceed the threshold voltage.

The CDAC 402 is a split CDAC that includes multiple segments separated by a capacitor. Each segment includes multiple capacitors and a plurality of switches coupled to each capacitor. The CDAC 402 includes segment 412 and segment 422. Implementations of the CDAC 402 include two or more segments. The segment 412 includes capacitors 414 and switches 416. The switches 416 selectably connect one of the signal input terminal 420, the reference voltage 418, or ground to each of the capacitors 414. The switches 416 are coupled to the successive approximation circuitry 406 and controlled by the switch control signals 428 generated by the successive approximation circuitry 406. Implementations of the analog-to-digital converter 400 include any number of capacitors 414, capacitors 424, switches 416, and switches 426 needed to provide a desired number of output bits.

The segment 422 includes capacitors 424 and switches 426. The switches 426 selectably connect one of the reference voltage 432 or ground to each of the capacitors 424. The switches 426 are coupled to the successive approximation circuitry 406 and controlled by the switch control signals 428 generated by the successive approximation circuitry 406.

The buffer circuit 410 buffers the reference voltage 408 to produce the reference voltage 418 that is provided to the switches 416. The decoupling capacitor 411 is provided external to an integrated circuit that includes the analog-to-digital converter 400. The buffer circuit 430 is coupled to the buffer circuit 410 and buffers the reference voltage 418 to generate the reference voltage 432 provided to the switches 426.

In the analog-to-digital converter 400, the comparator 404 and the successive approximation circuitry 406 are powered by a low voltage power supply (e.g., 1.5 volts), and other circuitry of the analog-to-digital converter 400 is powered by a high voltage power supply (e.g., 5 volts). Providing the comparator 404 and the successive approximation circuitry 406 in a low voltage process reduces the size, power consumption, and delay of the comparator 404 and the successive approximation circuitry 406. However, because of the low voltage of the switch control signals 428, the level shifter 434 is coupled to the successive approximation circuitry 406 to level shift the switch control signals 428 up to the higher voltage needed to drive the switches 416 and the switches 426. The propagation through level shifter 434 introduces delay at each bit decision, which increases the conversion time (or reduces the settling time) of the analog-to-digital converter 400 (e.g., by the delay times the number of output bits of the analog-to-digital converter 400).

Figure 5:
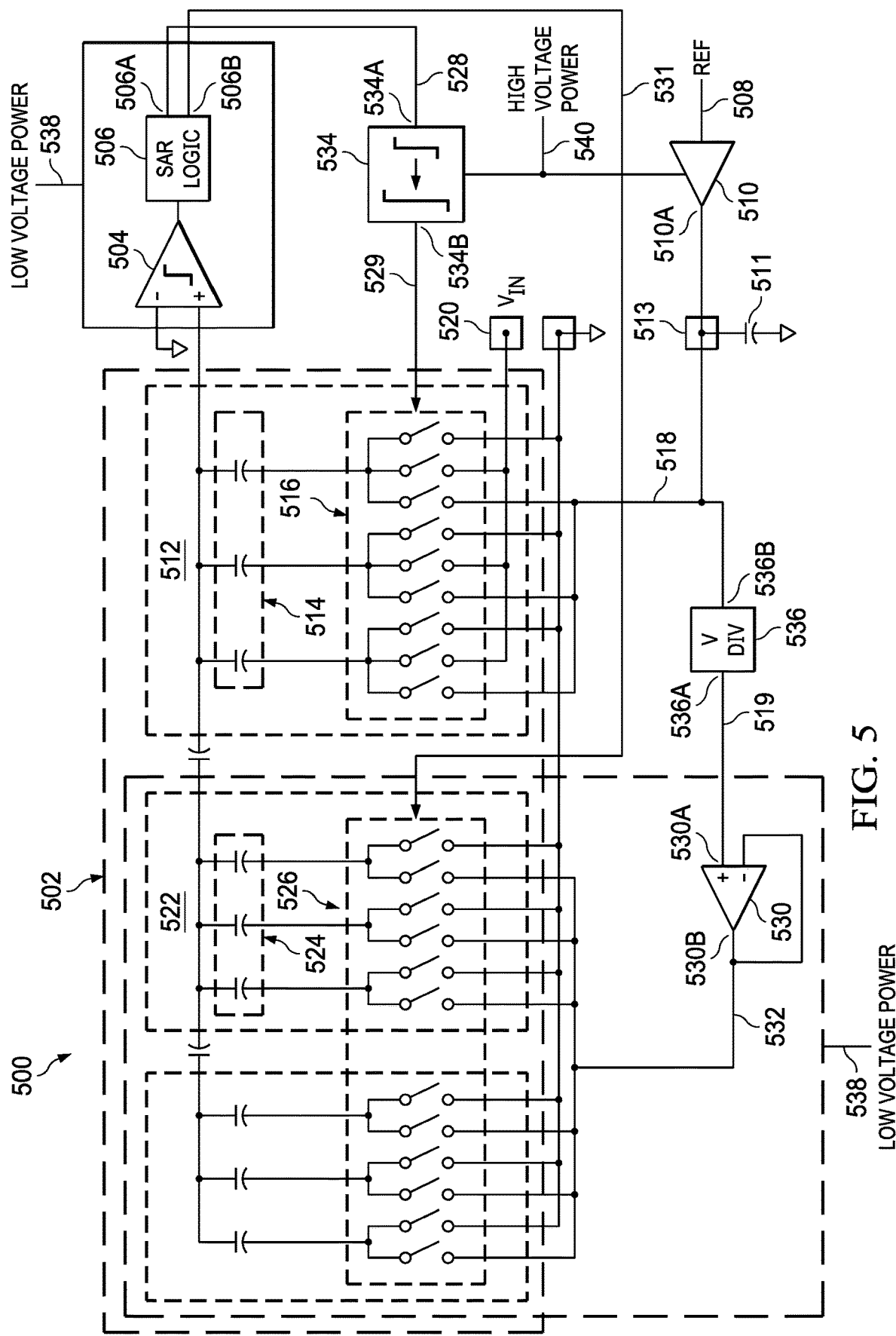
FIG. 5 shows a block diagram for an example analog-to-digital converter that operates a portion of the capacitive digital-to-analog converter in a low voltage domain.

FIG. 5 shows a block diagram for an example analog-to-digital converter 500 that operates a portion of the CDAC in the low voltage domain. The analog-to-digital converter 500 is an implementation of the SAR ADC 102 or the SAR ADC 104. The analog-to-digital converter 500 includes a CDAC 502, a comparator 504, successive approximation circuitry 506, a level shifter 534, a buffer circuit 510, a buffer circuit 530, and a voltage divider 536. The comparator 504 is coupled to the CDAC 502 and compares output of the CDAC 502 to a threshold voltage to determine whether a current setting of the CDAC 502 exceeds the threshold voltage. The successive approximation circuitry 506 is coupled to the comparator 504 and the CDAC 502, and controls the CDAC 502 based on the output of the comparator 504. For example, if the output of the comparator 504 indicates that the output of the CDAC 502 exceeds the threshold voltage, then the successive approximation circuitry 506 changes the input to the CDAC 502 to identify a next highest value bit for which the output of the CDAC 502 does not exceed the threshold voltage.

The CDAC 502 is a split CDAC that includes multiple segments separated by a capacitor. Each segment includes multiple capacitors and a plurality of switches coupled to each capacitor. The CDAC 502 includes segment 512 and segment 522. Implementations of the CDAC 502 include two or more segments. The segment 512 is configured to convert the MSBs of the analog-to-digital converter 500 output, while the segment 522, and any other segments, are configured to convert bits of lower significance. The segment 512 includes capacitors 514 and switches 516. The switches 516 selectably connect one of the signal input terminal 520, the reference voltage 518, or ground to each of the switches 516. The switches 516 are coupled to the successive approximation circuitry 506, via the level shifter 534. and controlled by the switch control signals 528 generated by the successive approximation circuitry 506. Implementations of the analog-to-digital converter 500 include any number of capacitors 514, capacitors 524, switches 516, and switches 526 needed to provide a desired number of output bits.

The segment 522 includes capacitors 524 and switches 526. The switches 526 selectably connect one of the reference voltage 532 or ground to each of the capacitors 524. The switches 526 are coupled to the successive approximation circuitry 506 and controlled by the switch control signals 528 generated by the successive approximation circuitry 506.

The output 510A of the buffer circuit 510 is coupled to the switches 516 and the reference voltage terminal 513. The buffer circuit 510 buffers the reference voltage 508 to produce the reference voltage 518 that is provided to the switches 516. The decoupling capacitor 511 is coupled to the reference voltage terminal 513 and is provided external to an integrated circuit that includes the analog-to-digital converter 500. The voltage divider 536 includes an input 536B coupled to the output 510A of the buffer circuit 510. The voltage divider 536 divides the reference voltage 518 by a value that produces the reference voltage 532. Some implementations of the voltage divider 536 include a resistive voltage divider network. For example, the voltage divider 536 includes a resistive voltage divider network that divides the reference voltage 518 by four in some implementations of the analog-to-digital converter 500. The input 530A of the buffer circuit 530 is coupled to an output 536A of the voltage divider 536, and the output 530B of the buffer circuit 530 is coupled to the switches 526. The buffer circuit 530 buffers the divided reference voltage 519 to generate the reference voltage 532 provided to the switches 526.

In the analog-to-digital converter 500, most of the circuitry is coupled to a low voltage power rail 538 and powered by a low voltage power supply (e.g., 1.5 volts) to reduce circuit size, power consumption and delay. For example, the comparator 504, the successive approximation circuitry 506, the buffer circuit 530, and the segment 522 are implemented in a low voltage semiconductor process and coupled to the low voltage power supply rail 538, while the level shifter 534 and the buffer circuit 510 are implemented in a high voltage semiconductor process and coupled to a high voltage power rail 540. Implementing the buffer circuit 530 in a low voltage process with fast transistors reduces the settling time of the reference voltage 532, which allows for a reduction in conversion time.

The level shifter 534 includes inputs 534A that are coupled to the outputs 506A of the successive approximation circuitry 506, and outputs 534B that are coupled to the switches 516. The level shifter 534 level shifts the switch control signals 528 up to the higher voltage needed to drive the switches 516. In the analog-to-digital converter 500, the level shifter 534 drives only switches of the segment 512 (e.g., only the switches coupled to the capacitors 514, where the capacitors 514 sample the signal received at the signal input terminal 520). All the capacitors of the CDAC 502 that sample signal received at the signal input terminal 520 are disposed in the segment 512. The switches 526 (and switches of all segments other than the segment 512) are coupled to the outputs 506B of the successive approximation circuitry 506 and are driven by the low voltage control signals 531. Thus, the delay introduced by the level shifter 534 is eliminated for most bit decisions.

In the integrated circuit 100, a single instance of the buffer circuit 510 and a single instance of the reference voltage terminal 513 are provided to generate the reference voltage 518 applied in the SAR ADC 102 and the SAR ADC 104, where the SAR ADC 102 and the SAR ADC 104 are implementations of the analog-to-digital converter 500. A single instance of the voltage divider 536 is provided to produce the divided reference voltage 519 by dividing the reference voltage 518. A first instance of the buffer circuit 530 is coupled to the voltage divider 536 to generate the reference voltage 532 used in the SAR ADC 102, and a second instance of the buffer circuit 530 is coupled to the voltage divider 536 to generate the reference voltage 532 used in the SAR ADC 104. Thus, each instance of the analog-to-digital converter 500 provided on an integrated circuit includes an instance of the CDAC 502, an instance of the comparator 504, an instance of the successive approximation circuitry 506, an instance of the buffer circuit 530, and an instance of the level shifter 534, while multiple instances of the analog-to-digital converter 500 on the integrated circuit share a single instance of the buffer circuit 510, the reference voltage terminal 513, and the voltage divider 536.

Modifications are possible in the described embodiments, and other embodiments are possible, within the scope of the claims.

What is claimed is:

1. An analog-to-digital converter, comprising:
   a low voltage power supply terminal;
   a high voltage power supply terminal;
   successive approximation circuitry coupled to the low voltage power supply terminal;
   a level shifter coupled to the high voltage power supply terminal and comprising inputs coupled to first outputs of the successive approximation circuitry;
   a capacitive digital-to-analog converter (CDAC) comprising:
      a first segment comprising:
         a first plurality of capacitors; and
         a first plurality of switches coupled to outputs of the level shifter; and
      a second segment comprising:
         a second plurality of capacitors; and
         a second plurality of switches coupled to second outputs of the successive approximation circuitry.

2. The analog-to-digital converter of claim 1, wherein:
   the first plurality of switches is configured to operate at a voltage of the high voltage power supply; and the second plurality of switches is configured to operate at a voltage of the low voltage power supply.

3. The analog-to-digital converter of claim 1, further comprising:
a reference voltage terminal;
a buffer circuit coupled to the high voltage power supply terminal, and comprising an output coupled to the first plurality of switches and the reference voltage terminal.

4. The analog-to-digital converter of claim 3, further comprising a voltage divider coupled to the output of the buffer circuit.

5. The analog-to-digital converter of claim 4, wherein:
the buffer circuit is a first buffer circuit; and
the analog-to-digital converter comprises a second buffer circuit coupled to the low voltage power supply terminal, and comprising:
an input coupled to the voltage divider; and
an output coupled to the second plurality of switches.

6. The analog-to-digital converter of claim 4, wherein the voltage divider is configured to divide output voltage of the buffer circuit by four.

7. The analog-to-digital converter of claim 1, further comprising a signal input terminal, wherein all capacitors of the CDAC that are coupled to the signal input terminal are disposed in the first segment.

8. The analog-to-digital converter of claim 1, further comprising a comparator coupled to the CDAC and the successive approximation circuitry.

9. The analog-to-digital converter of claim 1, wherein the first segment is configured to convert bits of higher significance than the second segment.

10. An analog-to-digital converter, comprising:
a reference voltage terminal;
a first buffer circuit comprising an output coupled to the reference voltage terminal;
a voltage divider comprises an input coupled to the output of the first buffer circuit;
a second buffer circuit comprising an input coupled to an output of the voltage divider;
successive approximation circuitry;
a level shifter coupled to first outputs of the successive approximation circuitry;
a capacitive digital-to-analog converter (CDAC) comprising:
a first segment comprising:
a first plurality of capacitors; and
a first plurality of switches coupled to outputs of the level shifter, and the output of the first buffer circuit;
a second segment comprising:
a second plurality of capacitors; and
a second plurality of switches coupled to second outputs of the successive approximation circuitry, and an output of the second buffer circuit.

11. The analog-to-digital converter of claim 10, wherein the voltage divider is configured to divide output voltage of the first buffer circuit by four.

12. The analog-to-digital converter of claim 10, further comprising:
a low voltage power supply terminal;
a high voltage power supply terminal;
wherein:
the first buffer circuit and the level shifter are coupled to the high voltage power supply; and
the second buffer circuit and the successive approximation circuitry are coupled to the low voltage power supply.

13. The analog-to-digital converter of claim 10, further comprising a signal input terminal; wherein all capacitors of the CDAC coupled to the signal input terminal are disposed in the first segment.

14. The analog-to-digital converter of claim 10, wherein the first segment is configured to convert bits of higher significance than the second segment.

* * * * *